(12) United States Patent
Tatsumi et al.

(10) Patent No.: US 8,469,342 B2
(45) Date of Patent: Jun. 25, 2013

(54) SUBSTRATE SUCTION APPARATUS AND METHOD FOR MANUFACTURING THE SAME

(75) Inventors: Yoshiaki Tatsumi, Kawasaki (JP); Kinya Miyashita, Kawasaki (JP)

(73) Assignee: Creative Technology Corporation, Tokyo (JP)

( * ) Notice: Subject to any disclaimer, the term of this patent is extended or adjusted under 35 U.S.C. 154(b) by 678 days.

(21) Appl. No.: 12/669,856

(22) PCT Filed: Jun. 5, 2008

(86) PCT No.: PCT/JP2008/060341
§ 371 (c)(1), (2), (4) Date: Mar. 4, 2010

(87) PCT Pub. No.: WO2009/013941
PCT Pub. Date: Jan. 29, 2009

(65) Prior Publication Data
US 2010/0194012 A1 Aug. 5, 2010

(30) Foreign Application Priority Data
Jul. 23, 2007 (JP) ................................. 2007-190601

(51) Int. Cl.
*B25B 11/00* (2006.01)
(52) U.S. Cl.
USPC ............................................. 269/21; 269/903
(58) Field of Classification Search
USPC ................................................... 269/21, 903
See application file for complete search history.

(56) References Cited

U.S. PATENT DOCUMENTS 4,521,995 A * 6/1985 Sekiya .......................... 451/388
4,969,168 A    11/1990 Sakamoto et al.
(Continued)

FOREIGN PATENT DOCUMENTS

| DE | 68927364 T2 | 3/1997 |
|---|---|---|
| EP | 0357424 A2 | 3/1990 |

(Continued)

OTHER PUBLICATIONS

International Search Report of PCT/JP2008/060341, mailing date of Jul. 1, 2008.

*Primary Examiner* — Joshua J Michener
*Assistant Examiner* — Matthew Gitlin
(74) *Attorney, Agent, or Firm* — Westerman, Hattori, Daniels & Adrian, LLP

(57) ABSTRACT

Provided is a substrate suction apparatus which has a vacuum suction mechanism and an electrostatic attraction mechanism, and improves planarity of a subject to be processed by improving uniformity in vacuum suction power. A method for manufacturing such substrate suction apparatus is also provided. A substrate suction apparatus (1) is provided with a base board (2), a dielectric body (3), an electrostatic attraction mechanism (4) and a vacuum suction mechanism (5). Specifically, the dielectric body (3) is composed of a downmost dielectric layer (31), an intermediate dielectric layer (32) and a topmost dielectric layer (33). The electrostatic attraction mechanism (4) is composed of attraction electrodes (41, 42) and a direct current power supply. The vacuum suction mechanism (5) is composed of a groove (51), a suction channel (52), a porous dielectric body (3) and the porous attraction electrodes (41, 42). The downmost dielectric layer (31), the intermediate dielectric layer (32) and the topmost dielectric layer (33) are formed by spraying ceramic particles, and the attraction electrodes (41, 42) are formed by spraying tungsten particles. The average pore diameter and porosity of the downmost dielectric layer (31) are set maximum, and those of the topmost dielectric layer (33) are set minimum.

6 Claims, 8 Drawing Sheets

U.S. PATENT DOCUMENTS

| | | | |
|---|---|---|---|
| 7,196,775 B2 * | 3/2007 | Galburt | 355/75 |
| 2003/0007308 A1 | 1/2003 | Harada et al. | |
| 2003/0165043 A1 * | 9/2003 | Logan et al. | 361/234 |
| 2003/0196599 A1 * | 10/2003 | Sun et al. | 118/621 |
| 2005/0036267 A1 * | 2/2005 | Savas et al. | 361/234 |

FOREIGN PATENT DOCUMENTS

| | | |
|---|---|---|
| EP | 1258918 A1 | 11/2002 |
| JP | 2-198353 A | 8/1990 |
| JP | 2001-203258 A | 7/2001 |
| JP | 2003-107487 A | 4/2003 |
| JP | 2003-318160 A | 11/2003 |
| JP | 2004-298970 A | 10/2004 |
| JP | 2005-109358 A | 4/2005 |
| JP | 2007-053405 A | 3/2007 |
| TW | 240015 B | 9/2005 |
| WO | 01/54188 A1 | 7/2001 |

* cited by examiner

SUBSTRATE SUCTION APPARATUS AND METHOD FOR MANUFACTURING THE SAME

TECHNICAL FIELD

The present invention relates to substrate suction apparatuses for holding and carrying wafers, liquid crystal display substrates and the like utilized in semiconductor manufacturing equipment and liquid crystal display devices, and to a method of manufacturing such substrate suction apparatuses.

BACKGROUND ART

Vacuum chuck apparatuses and electrostatic chuck apparatuses are among this kind of substrate suction apparatuses.

A vacuum chuck apparatus embodies a vacuum suction technology of sucking up a substrate by sucking away the air between the substrate and the chuck apparatus so as to create a negative pressure therebetween. Since the apparatus sucks up the whole surface of a substrate with a strong negative pressure, it is possible to suck up even a substrate easy to warp while restraining it from warping. However, vacuum chuck apparatuses cannot be utilized under a vacuum atmosphere without gas. Therefore, they are not applicable to apparatuses utilizing vacuum such as plasma processing apparatuses, ion implantation apparatuses, ion doping apparatuses, liquid crystal substrate compositing apparatuses, exposure apparatuses of electron beam, EUV and the like, wafer inspection apparatuses, etc.

On the other hand, an electrostatic chuck apparatus can be utilized either under a vacuum atmosphere or under an air atmosphere because it electrostatically attracts up a substrate by virtue of electrostatic force acting between the substrate and the apparatus. Therefore, electrostatic chuck apparatuses are positioned as indispensable in the recent semiconductor manufacturing technologies which employ a great number of apparatuses utilizing vacuum. However, since the electrostatic chuck apparatuses are not provided with a strong suction power, it is more difficult for them than the vacuum chuck apparatuses to deal with warping of the substrates.

In view of the above problems, as disclosed in the following Patent Documents 1 to 4, there are proposed substrate suction apparatuses which include a vacuum suction mechanism and an electrostatic attraction mechanism.

By employing these apparatuses, inside an exposure apparatus and the like, for example, an exposure process and the like can be carried out under a vacuum atmosphere by first flattening a warped substrate through vacuum suction and then switching it to electrostatic attraction.

Patent Document 1: Japanese Patent Application Publication No. 2003-318160;
Patent Document 2: Japanese Patent Application Publication No. 2003-107487;
Patent Document 3: Japanese Patent Application Publication No. 2007-053405;
Patent Document 4: Japanese Patent Application Publication No. 2005-109358; and
Patent Document 5: Japanese Patent Application Publication No. 2004-298970.

DISCLOSURE OF THE INVENTION

Nevertheless, as will be described hereinbelow, there are problems with the aforementioned conventional substrate suction apparatuses.

In recent years, planarity of a substrate and uniformity of suction force have been required at a high level in sucking up the substrate.

This is because there are growing needs to improve performances in cooling the substrate and keeping the apparatus at a constant temperature by uniforming or equalizing the contact pressure between the suction surface of the apparatus and the underside surface of the substrate. Another reason is that it is necessary to flatten the substrates as much as possible for exposure apparatuses and the like because super miniaturizations have been required for wiring patterns on the substrates. Further, the industry is moving in the direction of thinning silicon wafers as a so-called "ecological measure" for silicon resources. A wafer 300 mm long in diameter is 0.8 mm in thickness at the present time, but is expected to be thinned down to approximately 0.2 mm in the future. Further, the movement of thinning substrates is not with respect only to wafers but to liquid crystal display substrates as well. However, thinned substrates become low in rigidity, thereby being subject to influences from the suction surface of the substrate suction apparatus. As a result, they may become easy to deform. Hence, planarity and uniformity in substrate suction are required at a higher level.

However, the vacuum suction mechanism in the aforementioned conventional substrate suction apparatuses is of such a structure as a plurality of holes are drilled on the suction surface of the apparatus, so as to suck up the substrate with a vacuum force created by sucking away the air through the holes. Hence, the suction force on the substrate is strong around the holes whereas weak off the holes, thereby lacking in uniformity. Therefore, it was concerned that a thinned substrate and the like might degrade in planarity because they would get dented in the hole portions.

To address the above problem, there is also proposed a vacuum chuck apparatus with improved uniformity in suction force by forming the suction surface out of a porous material such as ceramics and the like (for example, see Patent Document 5).

However, in this case, since the porous material is formed by sintering granular substances such as ceramics and the like, pore size and distribution are not uniformed but varied and biased. Further, since the material is formed through sintering, it is not possible to control the pores to be formed uniformly in size and distribution. Therefore, it is practically impossible to make up a porous material which has a porosity from 5% to 25%, a small average pore diameter, and a nearly uniform pore distribution. In reality, a usable porous material can only be made with a porosity not lower than 30%. Consequently, applying a porous material with a great average pore diameter to the suction surface of the vacuum suction mechanism cannot acquire uniformity of the suction force and thereby cannot secure planarity of the substrate.

The present invention is made to solve the above problems and has as its object the provision of an substrate suction apparatus and a method for manufacturing such substrate suction apparatus which includes a vacuum suction mechanism and an electrostatic attraction mechanism for improving uniformity in vacuum suction force so as to upgrade planarity of a work piece.

In order to solve the above problems, an aspect of the present invention as set forth in claim 1 provides a substrate suction apparatus including: a base, a dielectric body being provided on the base and having a surface employed as a suction surface for a work piece, an electrostatic attraction mechanism for attracting up the work piece on the suction surface with an electrostatic force between the work piece and an attraction electrode provided inside the dielectric body, and a vacuum suction mechanism for sucking up the work piece on the suction surface by creating a negative pressure between the work piece and the suction surface of the dielectric body; the vacuum suction mechanism is composed of a suction portion opening on the base surface for sucking in a gas on the base surface side, the porous dielectric body formed on the base through spraying, and the porous attraction electrode formed inside the dielectric body through spraying.

By virtue of this configuration, with the work piece being placed on the suction surface of the dielectric body, when the vacuum suction mechanism is put into function to suck in the gas from the suction portion of the base, the gas between the suction surface and the work piece is sucked away through the pores in the dielectric body and attraction electrode, thereby creating a negative pressure between the suction surface and the work piece. As a result, the work piece is sucked up on the suction surface with its warped surface flattened.

In this state, as the electrostatic attraction mechanism is put into function after the vacuum suction mechanism is stopped, the work piece can be attracted up on the suction surface by an electrostatic force between the attraction electrode and the work piece. As a result, even under a vacuum atmosphere, a predetermined process can be carried out with respect to the work piece with its surface flattened.

However, if the vacuum suction mechanism is put into function to suck up an ultrathin work piece on the suction surface, the work piece may get dented in the pore portions to form numerous convexoconcaves on its underside surface and thereby degrade in planarity.

Therefore, in the substrate suction apparatus of the present invention, the vacuum suction mechanism is composed of a suction portion for sucking in a gas on the base surface side, a porous dielectric body formed on the base through spraying, and a porous attraction electrode formed inside the dielectric body through spraying, whereby pores can be uniformly distributed in the dielectric body and the attraction electrode. Further, spray particles small in average particle diameter are utilized to acquire a small average pore diameter.

In this manner, by virtue of spraying, pores small in average pore diameter are formed and distributed uniformly in the dielectric body and attraction electrode. Then, the ultrathin work piece is placed and sucked up on the suction surface of the dielectric body including the small pores in diameter, thereby allowing its entire underside surface to be uniformly sucked by virtue of the numerous small pores. Hence, even an ultrathin work piece will not get dented due to the pores. That is, since the work piece is sucked up uniformly by virtue of the small pores in diameter, its planarity is thus secured.

Another aspect of the present invention as set forth in claim 2 provides the substrate suction apparatus according to claim 1, wherein the suction portion of the vacuum suction mechanism is composed of a plurality of grooves recessed on the base surface and one or more suction channel(s) provided inside the base.

By virtue of this configuration, the gas is sucked into the plurality of grooves from the pores of the dielectric body, and then pumped to the outside through the suction channel.

Yet another aspect of the present invention as set forth in claim 3 provides the substrate suction apparatus according to claim 1, wherein the base is formed of a porous material, and its side surfaces and bottom surface are covered in an airtight manner with a nonporous member; the suction portion of the vacuum suction mechanism is composed of numerous pores of the base and a suction channel provided to the nonporous member.

By virtue of this configuration, a suction portion with a desired suction force may be formed without bringing complicated processes to the base, thereby facilitating reduction in manufacturing cost.

Yet another aspect of the present invention as set forth in claim 4 provides the substrate suction apparatus according to any one of claims 1 to 3, wherein the dielectric body is composed of a downmost dielectric layer formed as a lamina on the base through spraying, one or more intermediate dielectric layer(s) formed as a lamina on the downmost dielectric layer through spraying, and a topmost dielectric layer being formed as a lamina in the topmost position through spraying and having a surface employed as the suction surface; the average pore diameter and porosity of the downmost dielectric layer is set maximum whereas those of the topmost dielectric layer is set minimum.

By virtue of this configuration, the average pore diameter and porosity are diminished in a gradual manner upwardly from the downmost dielectric layer toward the topmost dielectric layer, whereby a smooth suction function becomes possible.

Yet another aspect of the present invention as set forth in claim 5 provides the substrate suction apparatus according to claim 4, wherein the average pore diameter and porosity of the pores in the downmost dielectric layer are set to 20 µm to 200 µm and 25% to 60%, respectively; those of the pores in the one or more intermediate dielectric layer(s) and attraction electrode are set to 10 µm to 150 µm and 20% to 50%, respectively; and those of the pores in the topmost dielectric layer are set to 5 µm to 20 µm and 5% to 25%, respectively.

Yet another aspect of the present invention as set forth in claim 6 provides the substrate suction apparatus according to any one of claims 1 to 5, wherein the dielectric body is formed by spraying ceramic particles; the attraction electrode is formed by spraying tungsten particles, molybdenum particles or nickel aluminum particles.

By virtue of this configuration, it is possible to easily form the dielectric body and attraction electrode with a desired average pore diameter and porosity.

Yet another aspect of the present invention as set forth in claim 7 provides a method for manufacturing the substrate suction apparatus, the method including: a base forming process for forming a base including a suction portion for sucking in a gas on its surface side, and a potential supply terminal projecting out of its surface from inside; an under layer forming process for forming a downmost dielectric layer maximum in average pore diameter and porosity as a lamina on the base through spraying; an electrode forming process for forming an attraction electrode smaller than the downmost dielectric layer in average pore diameter and porosity as a lamina on the downmost dielectric layer and on the end of the potential supply terminal through spraying; an intermediate layer forming process for forming one or more intermediate dielectric layer(s) nearly equal to the attraction electrode in average pore diameter and porosity as a lamina on the downmost dielectric layer in such a manner as to cover the attraction electrode through spraying; and an upper layer forming process for forming a topmost dielectric layer being minimum in average pore diameter and porosity and having a surface employed as a suction surface for a work piece as a lamina on the one or more intermediate dielectric layer(s) through spraying.

By virtue of this configuration, the base forming process is carried out to form a base including a suction portion for sucking in a gas on its surface side, and a potential supply terminal projecting out of its surface from inside; and the under layer forming process is carried out to form a downmost dielectric layer maximum in average pore diameter and porosity as a lamina on the base through spraying. Further, the electrode forming process is carried out to form an attraction electrode smaller than the downmost dielectric layer in average pore diameter and porosity as a lamina on the downmost dielectric layer and on the end of the potential supply terminal through spraying. Further, the intermediate layer forming process is carried out to form one or more intermediate dielectric layer(s) nearly equal to the attraction electrode in average pore diameter and porosity as a lamina on the downmost dielectric layer in such a manner as to cover the attraction electrode through spraying. Furthermore, the upper layer forming process is carried out to form a topmost dielectric layer being minimum in average pore diameter and porosity and having a surface employed as a suction surface for a work piece as a lamina on the one or more intermediate dielectric layer(s) through spraying.

Yet another aspect of the present invention as set forth in claim 8 provides the method according to claim 7 further including a grinding process for grinding the surface of the downmost dielectric layer so as to flush the end of the potential supply terminal into the surface of the downmost dielectric layer prior to the electrode forming process.

By virtue of this configuration, the grinding process is carried out prior to the electrode forming process to grind the surface of the downmost dielectric layer so as to flush the end of the potential supply terminal into the surface of the downmost dielectric layer.

Yet another aspect of the present invention as set forth in claim 9 provides the method according to claim 7 or 8, wherein the average particle diameter of the spray particles utilized in each of the processes is set such that: the average pore diameter and porosity of the pores in the downmost dielectric layer are 20 μm to 200 μm and 25% to 60%, respectively; those of the pores in the one or more intermediate dielectric layer(s) and attraction electrode are 10 μm to 150 μm and 20% to 50%, respectively; and those of the pores in the topmost dielectric layer are 5 μm to 20 μm and 5% to 25%, respectively.

Yet another aspect of the present invention as set forth in claim 10 provides the method according to any one of claims 7 to 9, wherein the downmost dielectric layer, the intermediate dielectric layer and the topmost dielectric layer are formed as laminas by spraying ceramic particles; the attraction electrode is formed as a lamina by spraying tungsten particles, molybdenum particles or nickel aluminum particles.

As described above in detail, according to the substrate suction apparatus of the present invention as set forth in claims 1 to 6, by virtue of the small pores in diameter formed on the suction surface of the dielectric body, the work piece can be sucked up uniformly to secure its planarity. Thereby, an excellent effect is available in improving uniformity of the vacuum suction force so as to upgrade planarity of the work piece. As a result, it is possible to equally secure planarity of the work piece under both air and vacuum atmospheres.

Especially, according to the substrate suction apparatus of the present invention, as set forth in claim 3, reduction in manufacturing cost can be expected; as set forth in claim 4, there is an effect in achieving a smooth suction function.

Further, according to the substrate suction apparatus of the present invention as set forth in claim 6, there is an effect in easily forming the dielectric body and attraction electrode with a desired average pore diameter and porosity.

According to the method for manufacturing the substrate suction apparatus of the present invention as set forth in claims 7 to 10, there are formed through spraying the downmost dielectric layer, the attraction electrode, the intermediate dielectric layer, and the topmost dielectric layer as laminas on the base. The average pore diameter and porosity of the pores in those laminas are diminished in a gradual manner upwardly from the downmost dielectric layer toward the topmost dielectric layer, whereby the vacuum suction force is high enough in uniformity to manufacture a substrate suction apparatus capable of securing planarity of the work piece. That is, by regulating the spray particles in average particle diameter, temperature, spraying velocity and the like, it is possible to easily and correctly control the average pore diameter and porosity of each layer or electrode. Thereby, an excellent effect is available in easily and correctly manufacturing the substrate suction apparatus with a desired vacuum suction performance.

Especially, according to the method of the present invention as set forth in claim 8, the end of the potential supply terminal is flushed or ground into the surface of the downmost dielectric layer, whereby it is possible to connect the attraction electrode to the potential supply terminal in a flat state.

DESCRIPTION OF NOTATIONS

1 . . . substrate suction apparatus, 2, 2'. . . base, 2a . . . surface, 3 . . . dielectric body, 3a . . . suction surface, 4 . . . electrostatic attraction mechanism, 5 . . . vacuum suction mechanism, 6 . . . metallic wall, 20 . . . cooling water passage, 21, 22 . . . through holes, 31 . . . downmost dielectric layer, 31d to 33d . . . particles, 32. . . intermediate dielectric layer, 33. . . topmost dielectric layer, 34 . . . sacrifice layer, 34a, 34b. . . projections, 41, 42 . . . attraction electrodes, 43 . . . DC power supply, 44, 45 . . . potential supply terminals, 44a, 45a . . . ends, 46 . . . switch, 47, 48 . . . isolation bushes, 50 . . . suction pump, 51 . . . groove, 51a . . . longitudinal groove, 51b . . . transverse groove, 52 . . . suction channel, 56 to 58 . . . pores, and W . . . substrate.

BEST MODES FOR CARRYING OUT THE INVENTION

Hereinafter, preferred embodiments will be described with reference to the drawings.

First Embodiment

Figure 1:
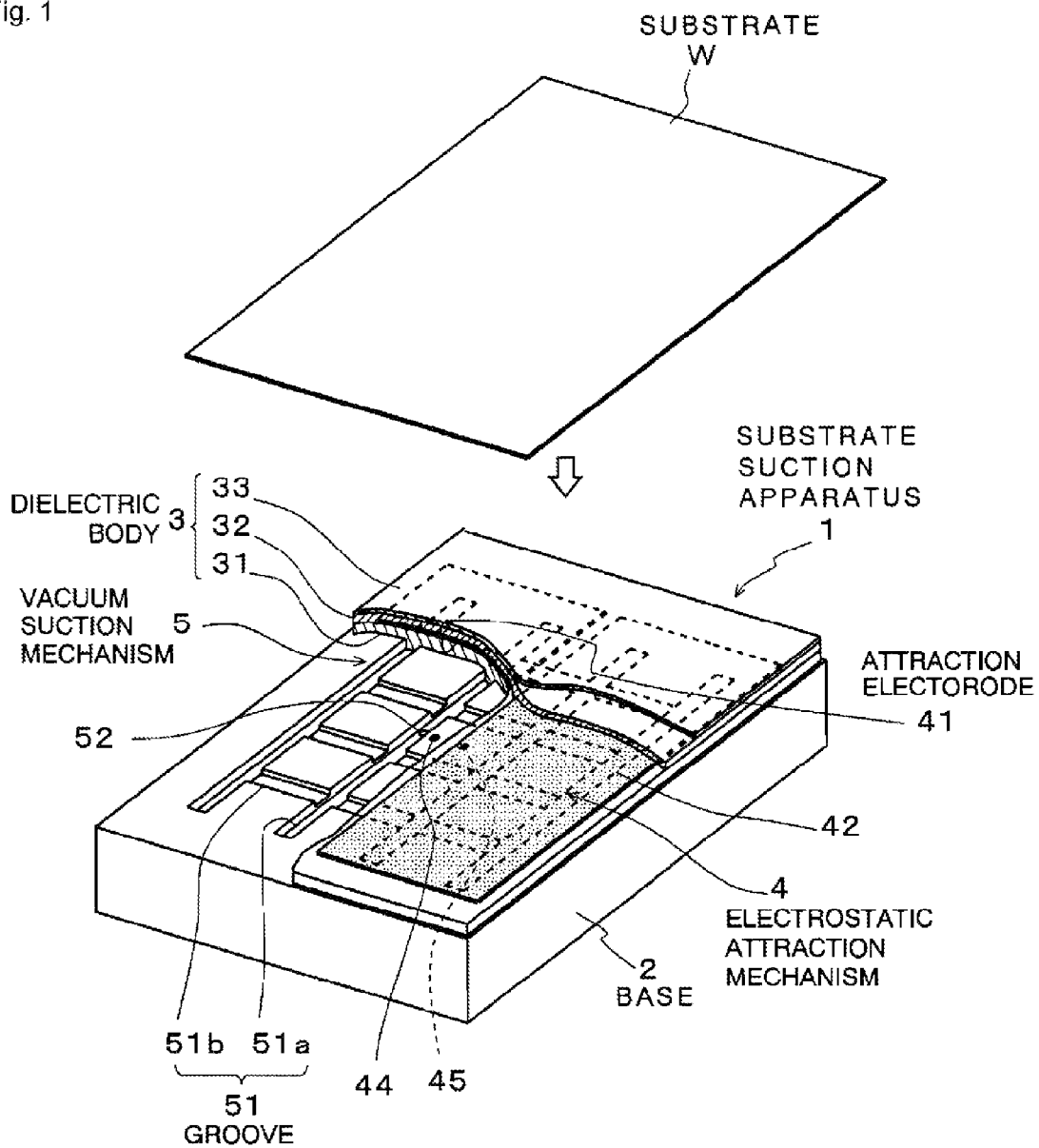
FIG. 1 is a perspective view showing a substrate suction apparatus with a fractured portion in accordance with a first embodiment of the present invention.
Figure 2:
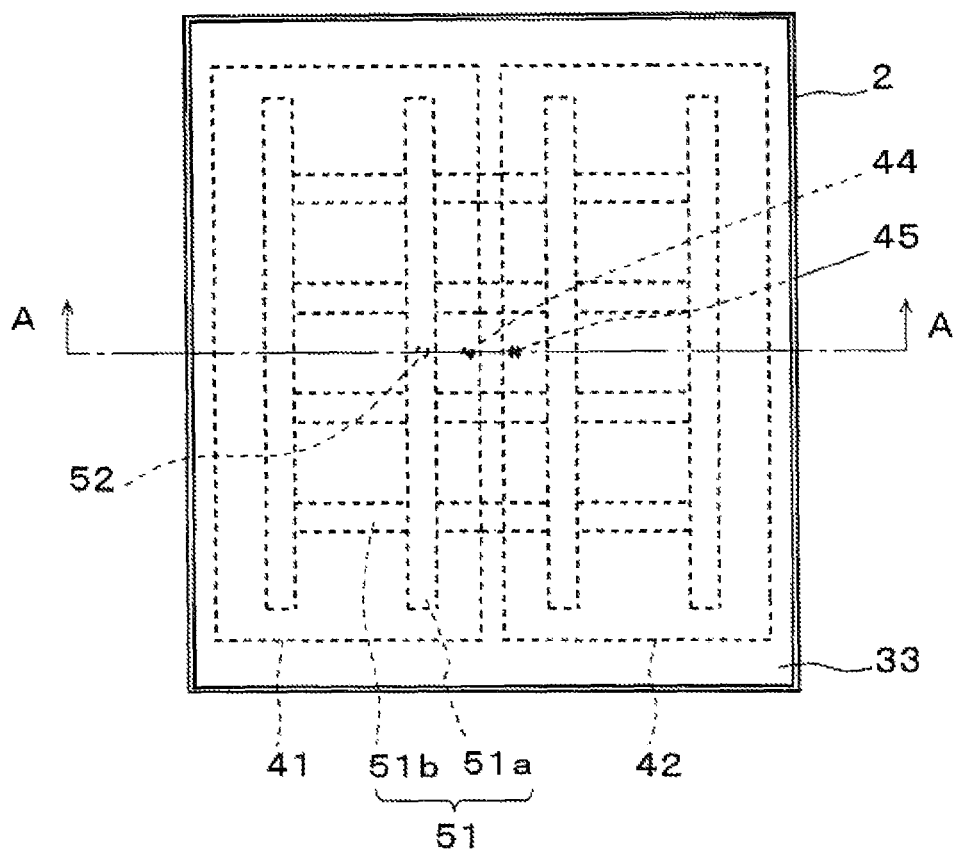
FIG. 2 is a plan view of the substrate suction apparatus.
Figure 3:
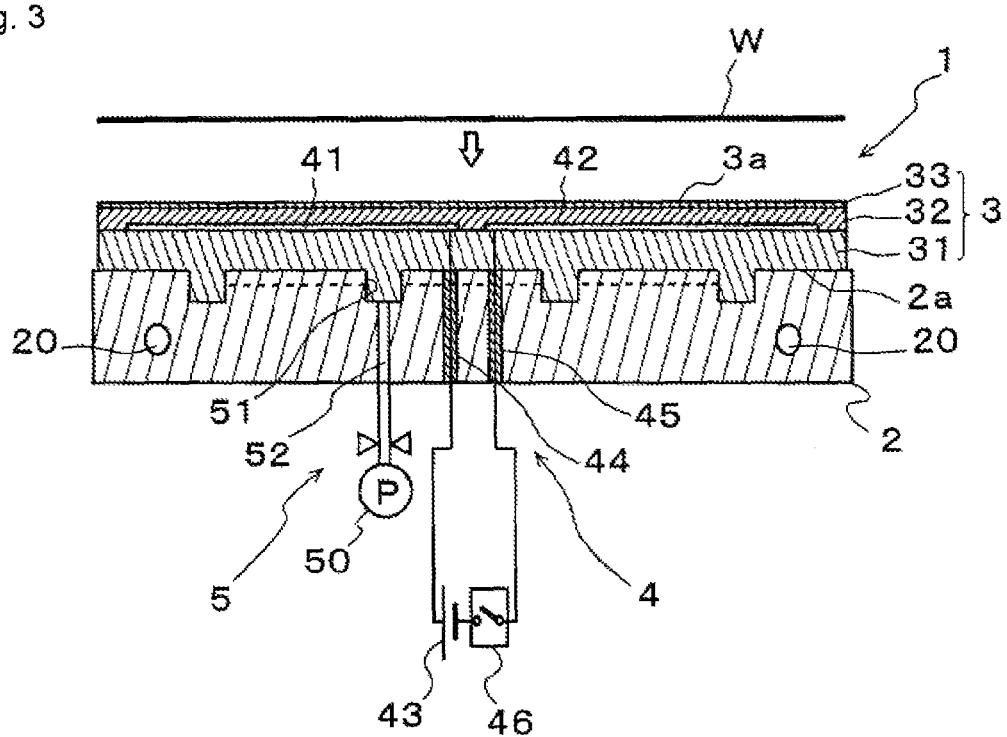
FIG. 3 is a cross-sectional view of the substrate suction apparatus, viewed along arrows A-A in FIG. 2.
Figure 4:
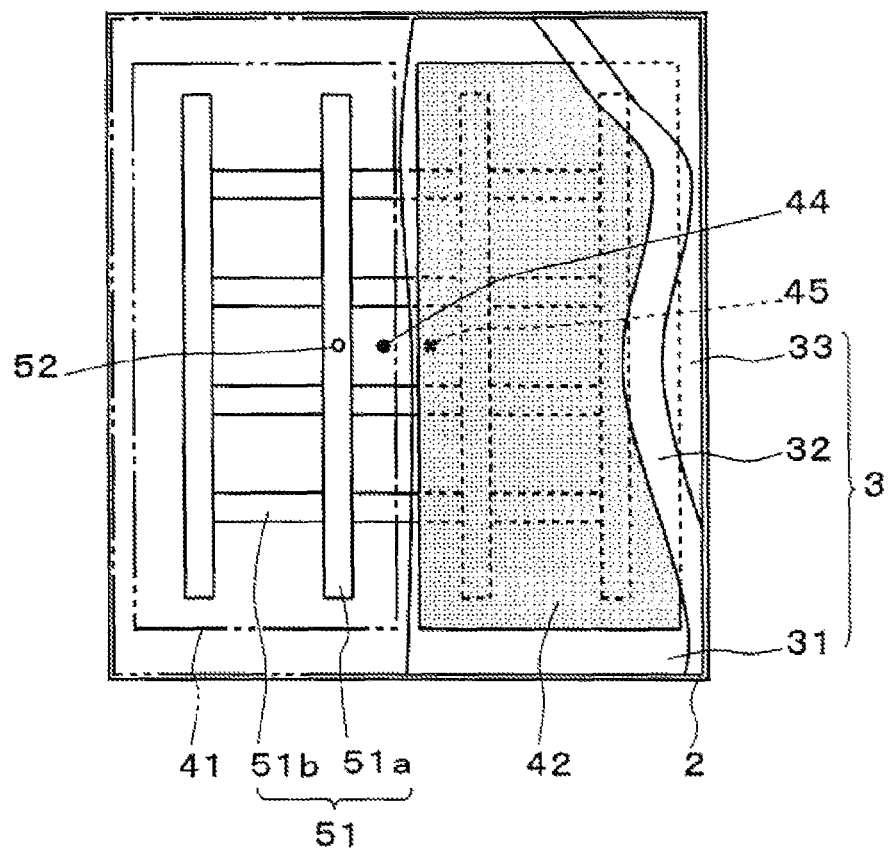
FIG. 4 is a plan view showing the substrate suction apparatus with a fractured portion.

FIG. 1 is a perspective view showing a substrate suction apparatus with a fractured portion in accordance with a first embodiment of the present invention; FIG. 2 is a plan view of the substrate suction apparatus; FIG. 3 is a cross-sectional view of the substrate suction apparatus, viewed along arrows A-A in FIG. 2; and FIG. 4 is a plan view showing the substrate suction apparatus with a fractured portion.

As shown in FIG. 1, in this embodiment, a substrate suction apparatus 1 is a apparatus for rectangular ultrathin substrates. The substrate suction apparatus 1 is provided with a base 2, a dielectric body 3, an electrostatic attraction mechanism 4, and a vacuum suction mechanism 5.

Alumina ceramics, titanium, aluminum, aluminum alloys and the like may be utilized as a material for the base 2. In the embodiment, the base 2 is formed of a rectangular board shaped up out of bulk alumina ceramics and, as shown in FIG. 3, is provided with cooling water passages 20 therein.

The dielectric body 3 is a laminate provided on the base 2 with its surface as a suction surface 3a for sucking up a substrate W as its work piece. The dielectric body 3 is composed of a downmost dielectric layer 31, an intermediate dielectric layer 32 and a topmost dielectric layer 33 which are formed by spraying. These layers 31 to 33, as will be described hereinafter, are formed of ceramics different in porosity, respectively.

The electrostatic attraction mechanism 4 is configured to attract up the substrate W on the suction surface 3a with electrostatic force, and is composed of attraction electrodes 41, 42 provided between the layers of the dielectric body 3, and a DC power supply 43.

In particular, the attraction electrodes 41, 42 are rectangular bipolar electrodes formed by spraying tungsten on the downmost dielectric layer 31. These attraction electrodes 41, 42 are connected to potential supply terminals 44, 45, respectively. The potential supply terminals 44, 45 are connected to the two electrodes of the DC power supply 43 via a switch 46.

The vacuum suction mechanism 5 is configured to suck up the substrate W on the suction surface 3a by creating a negative pressure between the substrate W and the suction surface 3a of the dielectric body 3. This vacuum suction mechanism 5 is composed of grooves 51 and a suction channel 52 as a suction portion for sucking in a gas on the surface side of the base 2, the porous dielectric body 3, and the porous attraction electrodes 41, 42.

As shown in FIG. 1, the grooves 51 are provided as recessed portions on the surface of the base 2. Concentric circles, spiral patterns, lattice shapes and the like may be applied to the shape of the grooves 51. In the embodiment, a lattice shape is applied.

In particular, the grooves 51 are formed by connecting four longitudinal grooves 51a approximately 1 mm deep and approximately 3 cm wide with four transverse grooves 51b approximately 0.5 mm deep and approximately 3 cm wide into a lattice. Then, as shown in FIG. 3, a suction channel 52 is provided in the base 2 with its upper end in communication with the longitudinal grooves 51a and its lower end in connection with a suction pump 50.

The porous dielectric body 3 is, as described above, composed of the downmost dielectric layer 31, the intermediate dielectric layer 32 and the topmost dielectric layer 33 which are formed on the base 2 by spraying ceramic particles.

In particular, the downmost electric layer 31 is formed on a surface 2a of the base 2 in a state of filling in the grooves 51, and its thickness is set to 300 μm above the surface 2a. Further, the average pore diameter of the downmost electric layer 31 is set to a maximum value of 40 μm. Furthermore, the porosity is set to approximately 30%.

Then, the attraction electrodes 41, 42 are formed by spraying tungsten particles on the downmost dielectric layer 31, and their thickness is set to 20 μm to 50 μm. Further, the average pore diameter of the attraction electrodes 41, 42 is set to 20 μm which is smaller than that of the downmost electric layer 31. Furthermore, the porosity is set to approximately 20%.

The intermediate dielectric layer 32 is formed on the downmost electric layer 31 to cover the attraction electrodes 41, 42, and its thickness is set to approximately 250 μm. Further, the average pore diameter of the intermediate dielectric layer 32 is set to 20 μm which is substantially equal to that of the attraction electrodes 41, 42. Furthermore, the porosity is also set to approximately 20%.

The topmost dielectric layer 33 is formed on the intermediate electric layer 32, and its thickness is set to 50 μm. Further, the average pore diameter of the topmost dielectric layer 33 is set to a minimum value of 10 μm. Furthermore, the porosity is set to approximately 5%.

Figure 5:
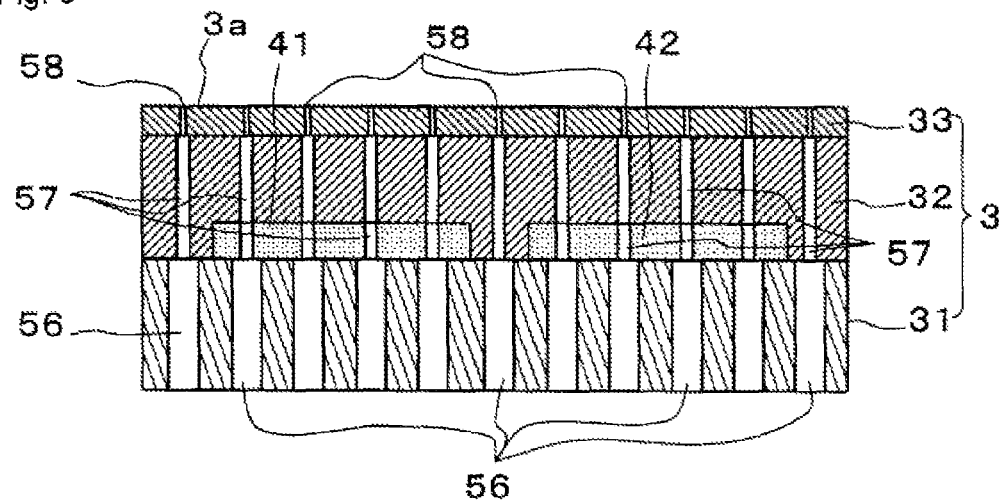
FIG. 5 is a schematic cross-sectional view for describing porosity and the like of each layer.

FIG. 5 is a schematic cross-sectional view for describing porosity and the like of each layer.

As described above, the average pore diameter and porosity of the downmost dielectric layer 31 are of maximum values, those of the topmost dielectric layer 33 are of minimum values, and those of the intermediate dielectric layer 32 and the attraction electrodes 41, 42 are of medium values thereof.

That is, to describe the pores of each layer in a schematic manner, as shown in FIG. 5, pores 56, the thickest, are formed in the downmost dielectric layer 31 uniformly in a predetermined number; pores 57, approximately half as thick as the pores 56, are formed in the intermediate dielectric layer 32 and the attraction electrodes 41, 42 uniformly in the aforementioned predetermined number; and pores 58, approximately one-fourth as thick as the pores 56, are formed in the topmost dielectric layer 33 uniformly in the aforementioned predetermined number. Accordingly, these pores 56 to 58 are in communication with each other, whereby the gas on the suction surface 3a of the topmost dielectric layer 33 is sucked into the minute pores 58 which open uniformly on the suction surface 3a, passes through the pores 57, 56, and is sucked smoothly into the grooves 51 shown in FIG. 3.

Next, a method for manufacturing the substrate suction apparatus 1 will be described.

Besides, the manufacturing method of the embodiment is a specific implementation of the method for manufacturing the substrate suction apparatus of the present invention.

Figure 6:
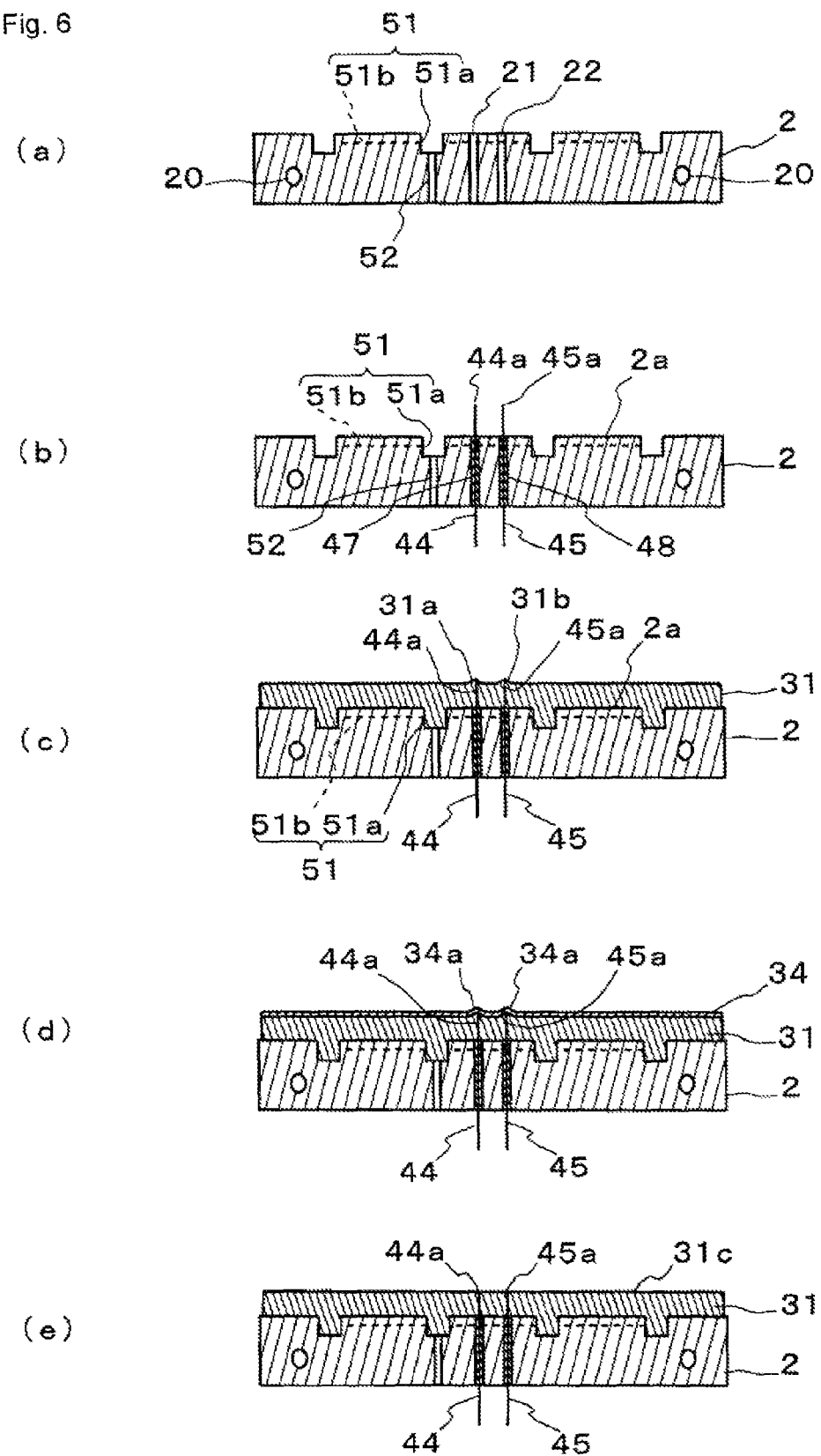
FIG. 6 is process flow diagram showing a base forming process, an under layer forming process and a grinding process.
Figure 7:
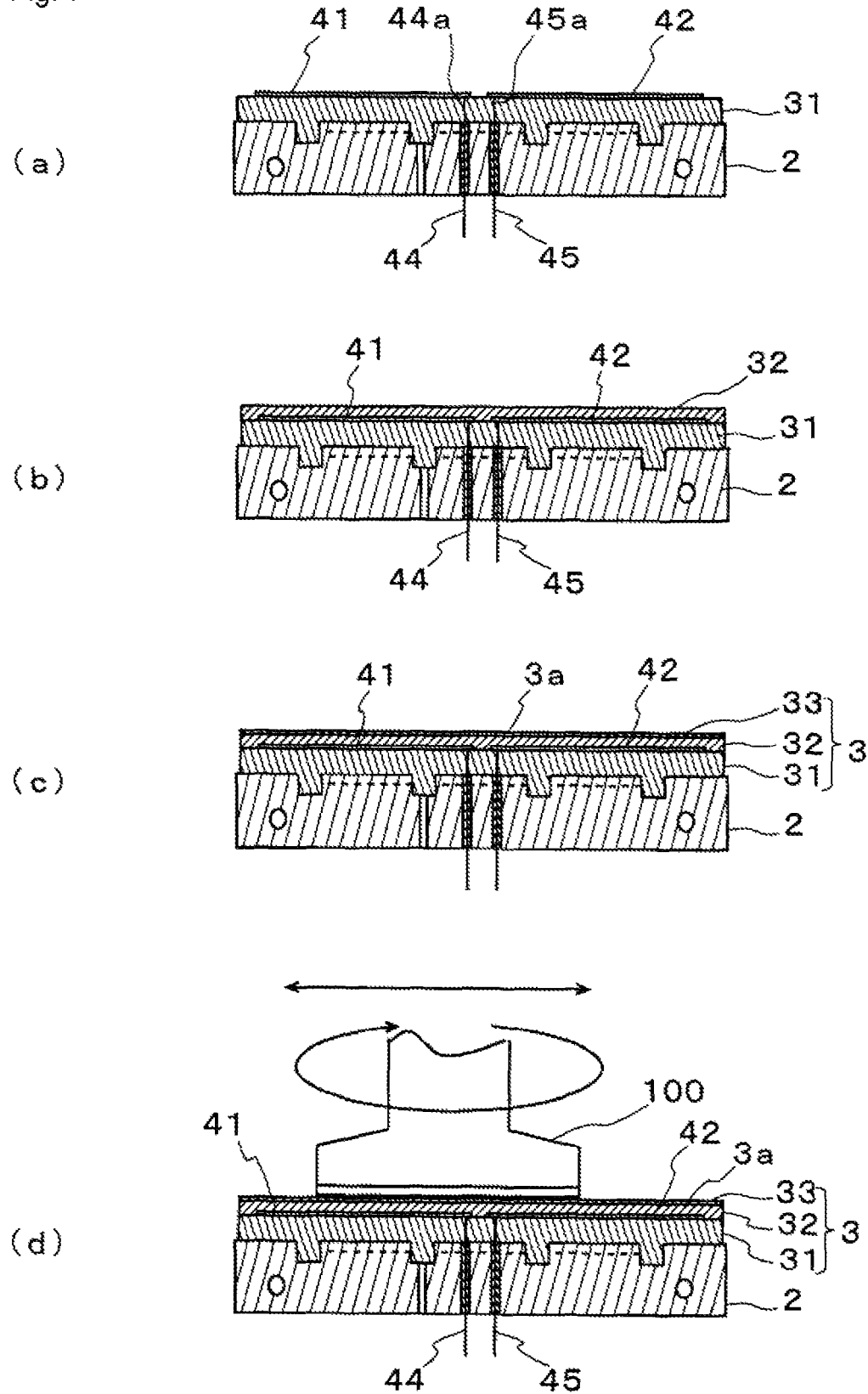
FIG. 7 is process flow diagram showing an electrode forming process, an intermediate layer forming process and an upper layer forming process.

FIG. 6 is process flow diagram showing abase forming process, an under layer forming process and a grinding process, and FIG. 7 is process flow diagram showing an electrode forming process, an intermediate layer forming process and an upper layer forming process.

The method for manufacturing the substrate suction apparatus 1 is accomplished by carrying out a base forming process S1, an under layer forming process S2, a grinding process S3, an electrode forming process S4, an intermediate layer forming process S5, and an upper layer forming process S6.

The base forming process S1 will be carried out. This base forming process S1 is a process to form the base 2.

In particular, as shown in FIG. 6(a), through the base forming process S1, a rectangular base 2 is formed out of bulk alumina ceramics, and is provided therein with cooling water passages 20 and grooves 51 which are composed of longitudinal grooves 51a approximately 1 mm deep and transverse grooves 51b approximately 0.5 mm deep. A suction channel 52 is provided through the base 2 to be in communication with a longitudinal groove 51a while through holes 21, 22 are provided in nearly the center portion of the base 2.

Then, as shown in FIG. 6(b), the potential supply terminals 44, 45 are inserted through the through holes 21, 22, and their ends 44a, 45a are projected out of the surface 2a of the base 2. In this state, nonporous ceramic isolation bushes 47, 48 are provided inside the through holes 21, 22 to finish the base forming process S1.

Next, the under layer forming process S2 will be carried out. This under layer forming process S2 is a process to form the downmost dielectric layer 31 as a lamina on the base 2.

In particular, as shown in FIG. 6(c), ceramic particles of 99.9% purity are sprayed to substantially fill in the grooves 51, and then further sprayed to form a lamina approximately 300 μm thick on the surface 2a of the base 2 to accomplish the downmost dielectric layer 31.

As a spraying method, plasma spraying, arc spraying, laser spraying and the like may be applied. In the embodiment, plasma spraying is adopted, utilizing ceramic particles which are 120 μm in average particle diameter to form the downmost dielectric layer 31 which is 40 μm in average pore diameter and approximately 30% in porosity.

When the under layer forming process S2 is finished, projections 34a, 34b will appear on the surface of the downmost dielectric layer 31 due to the ends 44a, 45a of the potential supply terminals 44, 45.

At this stage, the grinding process S3 will be carried out. This grinding process S3 is a process to flush or grind the ends of the potential supply terminals 44, 45 into the surface of the downmost dielectric layer 31.

In particular, as shown in FIG. 6(d), ceramic particles are sprayed from above the downmost dielectric layer 31 to form a sacrifice layer 34 approximately 20% in porosity as a lamina thereon. Then, as shown in FIG. 6(e), the sacrifice layer 34 and the downmost dielectric layer 31 are ground away approximately 10 μm to 20 μm in thickness from its top surface to form a flattened surface 31c of the downmost dielectric layer 31. Thereby, the ends 44a, 45a of the potential supply terminals 44, 45 are flushed or ground into the surface 31c of the downmost dielectric layer 31.

Then, the electrode forming process S4 will be carried out. This electrode forming process S4 is a process to form the attraction electrodes 41, 42 on the downmost dielectric layer 31.

In particular, as shown in FIG. 7(a), tungsten particles are sprayed respectively on the potential supply terminals 44, 45 exposed on the surface 31c of the downmost dielectric layer 31 to form 20 μm to 50 μm thick attraction electrodes 41, 42 as laminas on the downmost dielectric layer 31. Thereby, the attraction electrodes 41, 42 are in electric connection with the potential supply terminals 44, 45 in a flat state, respectively.

The same spraying method is adopted as for the aforementioned downmost dielectric layer 31 and the sacrifice layer 34 to form the attraction electrodes 41, 42 which are 20 μm in average pore diameter and approximately 20% in porosity by utilizing tungsten particles which are 100 μm in average particle diameter.

Next, the intermediate layer forming process S5 will be carried out. This intermediate layer forming process S5 is a process to form the intermediate dielectric layer 32 on the downmost dielectric layer 31.

In particular, as shown in FIG. 7(b), ceramic particles of 99.9% purity are sprayed from above the attraction electrodes 41, 42 on the surface 31c of the downmost dielectric layer 31 to form the intermediate dielectric layer 32 which is approximately 250 μm thick to cover the attraction electrodes 41, 42 on the downmost dielectric layer 31 as a lamina.

The same spraying method is adopted as for the aforementioned downmost dielectric layer 31 and the sacrifice layer 34 to form the intermediate dielectric layer 32 which is 20 μm in average pore diameter and approximately 20% in porosity by utilizing ceramic particles which are 100 μm in average particle diameter.

After the intermediate layer forming process S5 is finished, the upper layer forming process S6 will be carried out. This upper layer forming process S6 is a process to form the topmost dielectric layer 33 on the intermediate dielectric layer 32.

In particular, as shown in FIG. 7(c), ceramic particles of 99.9% purity are sprayed on the intermediate dielectric layer 32 to form the topmost dielectric layer 33 which is approximately 50 μm thick as a lamina.

The same spraying method is adopted as for the aforementioned downmost dielectric layer 31 and the intermediate dielectric layer 32 to form the topmost dielectric layer 33 which is 10 μm in average pore diameter and approximately 5% in porosity by utilizing ceramic particles which are 50 μm in average particle diameter.

Then, as shown in FIG. 7(d), the suction surface 3a of the topmost dielectric layer 33 is ground or polished into a flat surface with a grinder 100 to finish the whole manufacturing process.

Figure 8:
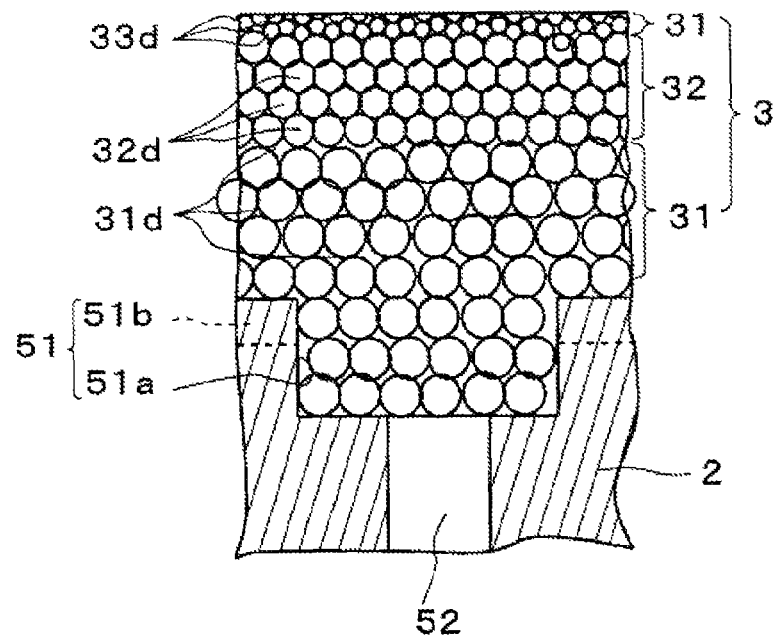
FIG. 8 is a partially enlarged schematic cross-sectional view for describing a relationship between the average pore diameter and porosity, and the average particle diameter, with respect to each layer.

FIG. 8 is a partially enlarged schematic cross-sectional view for describing a relationship between the average pore diameter and porosity, and the average particle diameter, with respect to each layer.

In the above manufacturing method, the average pore diameter and porosity of each layer are diminished in a gradual manner by diminishing the average particle diameter in the order of the downmost dielectric layer 31, the intermediate dielectric layer 32 and attraction electrodes 41, 42, and the topmost dielectric layer 33.

That is, as shown in FIG. 8, of the downmost dielectric layer 31 laminated inside the groove 51 and on the base 2, the particles 31d are sized greatest in such a manner as the porosity is set to approximately 30% while the average pore diameter defined by the clearance between the particles 31d is set to 40 μm. Further, of the attraction electrodes 41, 42 and the intermediate dielectric layer 32 laminated on the downmost dielectric layer 31, the particles 32d are sized smaller than the particles 31d in such a manner as the porosity is set to approximately 20% while the average pore diameter defined by the clearance between the particles 32d is set to 20 μm. Furthermore, of the topmost dielectric layer 33 laminated in the topmost position, the particles 33d are sized smallest in such a manner as the porosity is set to approximately 15% while the average pore diameter defined by the clearance between the particles 33d is set to 10 μm.

In this manner, by spraying ceramic particles to form laminas, the pores defined by the clearance between the particles 31d of the downmost dielectric layer 31, the pores defined by the clearance between the particles 32d of the intermediate dielectric layer 32 and attraction electrodes 41, 42 (see FIG. 3), and the pores defined by the clearance between the particles 33d of the topmost dielectric layer 33 are in communication with each other. As a result, as shown in the schematic view of FIG. 5, there is thus obtained the dielectric body 3 including pores which are uniformly distributed and diminish in average pore diameter from the lower layer up to the upper layer in a gradual manner.

That is, according to the manufacturing method of the embodiment, by regulating the ceramic particles in average particle diameter, temperature, spraying velocity and the like, it is possible to easily and correctly control the pores of the downmost dielectric layer 31, the intermediate dielectric layer 32, the attraction electrodes 41, 42, and the topmost dielectric layer 31 in average pore diameter and porosity. Hence, by forming the dielectric body 3 having a desired average pore diameter and porosity, and pores uniformly distributed therein, it is possible to easily and correctly manufacture a substrate suction apparatus having a desired vacuum suction performance.

Next, a description will be made with respect to the function and effect manifested by the substrate suction apparatus 1 of the embodiment.

Figure 9:
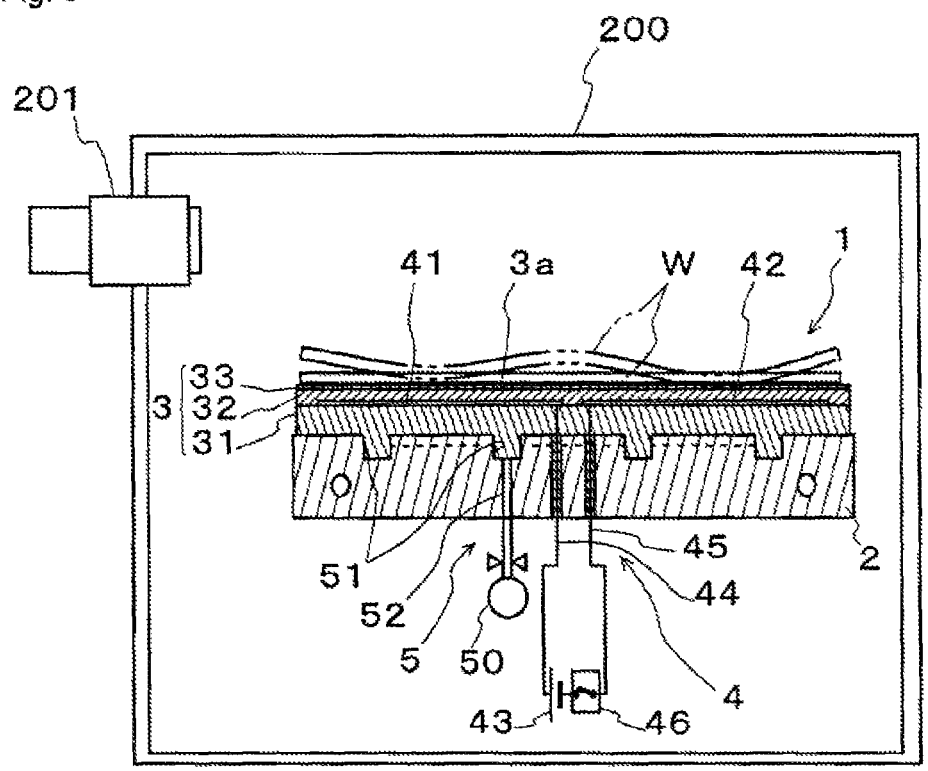
FIG. 9 is a schematic diagram showing an example of utilizing the substrate suction apparatus.
Figure 10:
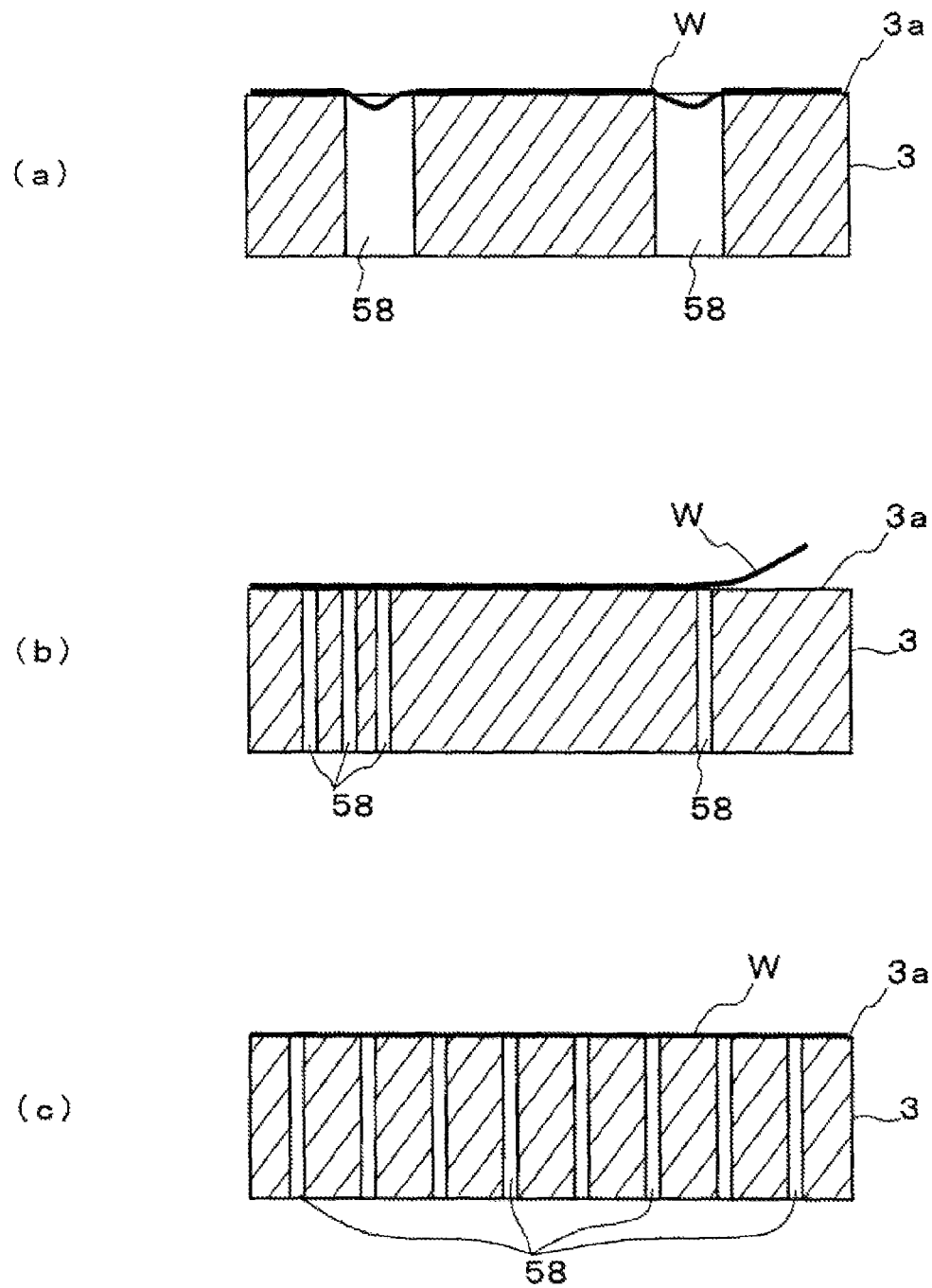
FIG. 10 is schematic cross-sectional view for schematically describing a vacuum suction function.

FIG. 9 is a schematic diagram showing an example of utilizing the substrate suction apparatus and FIG. 10 is schematic cross-sectional view for schematically describing a vacuum suction function.

When it is necessary to carry out a process with respect to the substrate W under a vacuum atmosphere such as plasma etching and the like, as shown in FIG. 9, the substrate W is placed on the suction surface 3a of the substrate suction apparatus 1 which is installed inside a chamber 200, and the vacuum suction mechanism 5 is put into function under an air atmosphere.

That is, the suction pump 50 is actuated to suck out the air inside the grooves 51 through the suction channel 52. Then, as shown in FIGS. 5 and 8, the air between the substrate W and the suction surface 3a is sucked away through the pores 56 to 58 defined by the clearances between the particles 31d to 33d of the dielectric body 3, so as to create a negative pressure between the substrate W and the suction surface 3a. As a result, as shown with the two-dot chain lines in FIG. 9, the warped and swelled ultrathin substrate W is sucked up on the suction surface 3a with its surface flattened.

In this state, the electrostatic attraction mechanism 4 is put into function after the vacuum suction mechanism 5 is stopped.

That is, by turning on a switch 46 to apply a DC power to the attraction electrodes 41, 42 from the DC power supply 43, an electrostatic force is generated between the substrate W and the attraction electrodes 41, 42 to attract up the substrate W on the suction surface 3a.

In this state, by utilizing a vacuum pump 201 to pump out the air inside the chamber 200, it is possible to carry out a plasma etching process and the like with respect to the substrate W under a vacuum atmosphere.

However, if the vacuum suction mechanism 5 is put into function to suck up an ultrathin substrate W on the suction surface 3a, depending on the pore size and distribution, the substrate W may get dented or bent in the pore portions.

For example, as shown in FIG. 10(a), if there is too great an average pore diameter of the pores 58 which open on the suction surface 3a of the dielectric body 3, the substrate W may be sucked into the pores 58, thereby forming numerous convexoconcaves thereon due to the pores 58.

Further, as shown in FIG. 10(b), pores 58 are small in average pore diameter. However, if they are biased to the left, for example, on the suction surface 3a in distribution or density, the substrate W may roll back on the right due to the insufficient suction force on the right side of the substrate W.

However, in the embodiment, as shown in FIG. 10(c), the substrate suction apparatus 1 is configured such that numerous pores 58 small in average pore diameter are distributed uniformly on the suction surface 3a, whereby the substrate W is uniformly sucked up on the suction surface 3a without getting dented into the pores 58 or rolling back. That is, the substrate W is uniformly sucked up by virtue of the numerous pores 58 small in diameter, whereby its planarity is secured.

Second Embodiment

Next, a second embodiment of the present invention will be described.

Figure 11:
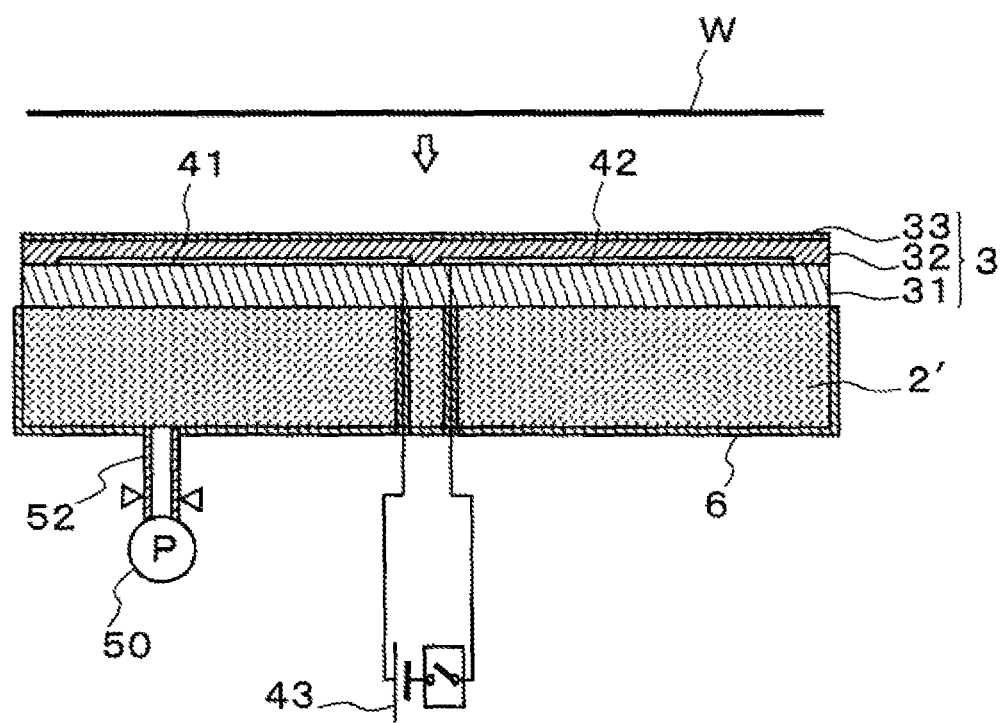
FIG. 11 is a cross-sectional view showing a substrate suction apparatus in accordance with a second embodiment of the present invention.

FIG. 11 is a cross-sectional view showing a substrate suction apparatus in accordance with the second embodiment of the present invention.

This embodiment is different from the aforementioned first embodiment in the aspect that the base is also formed of a porous material.

In particular, a base 2' is formed of ceramics which is approximately 30% to 50% in porosity, and its side surfaces and bottom surface are covered in an airtight manner with a nonporous metallic wall 6 formed of aluminum, titanium and the like. Then, the suction channel 52 is fitted to the bottom of the metallic wall 6 to be communicated with the pores of the base 2'.

Thereby, a suction portion is formed of the suction channel 52 and the numerous pores of the base 2'.

By virtue of this configuration, by putting the vacuum suction mechanism 5 into function, it is possible to pump the gas sucked in through the pores of the dielectric body 3 to the outside through the numerous pores of the base 2' and the suction channel 52.

According to the embodiment, it is possible to form a suction portion with a desired suction force without bringing complicated processes to the base such as forming the grooves 51 and the like, thereby facilitating reduction in manufacturing cost.

Other configurations, functions and effects are similar to those of the aforementioned first embodiment; hence, it should be appreciated that descriptions therefor are omitted.

Further, it is to be understood that the present invention is not limited to the aforementioned embodiments; various modifications and variations are possible within the true spirit and scope of the invention.

For example, in the aforementioned embodiments, bipolar attraction electrodes 41, 42 were applied. However, without being limited to this, a monopolar attraction electrode may, of course, be applied as the attraction electrode as well.

Further, in the aforementioned embodiments, an example was given to show that the dielectric body 3 was formed as a laminate by spraying ceramic particles. However, spray materials are not limited to ceramics; vitreous or resinous particles, for example, may also be sprayed to form the dielectric body 3 as a laminate.

Further, in the aforementioned embodiments, the average pore diameter was set to 40 μm, 20 μm, and 10 μm for the downmost dielectric layer 31, the attraction electrodes 41, 42 and the intermediate dielectric layer 32, and the topmost dielectric layer 33, respectively. However, without being limited to this, the average pore diameter may also be set to the ranges of 20 μm to 200 μm, 10 μm to 150 μm, and 5 μm to 20 μm for the downmost dielectric layer 31, the attraction electrodes 41, 42 and the intermediate dielectric layer 32, and the topmost dielectric layer 33, respectively.

Furthermore, in the aforementioned embodiments, an example was given to show that the attraction electrodes 41, 42 were formed as laminas by spraying tungsten particles. However, without being limited to this, the attraction electrode may also be formed by spraying molybdenum particles or nickel aluminum particles.

The invention claimed is:

1. A substrate suction apparatus comprising:
a base;
a dielectric body being provided on the base and having a surface employed as a suction surface for a work piece;
an electrostatic attraction mechanism for attracting up the work piece on the suction surface with an electrostatic force between the work piece and an attraction electrode provided inside the dielectric body; and
a vacuum suction mechanism for sucking up the work piece on the suction surface by creating a negative pressure between the work piece and the suction surface of the dielectric body,
the vacuum suction mechanism being composed of a suction portion opening on the base surface for sucking in a gas on the base surface side, the dielectric body being porous and formed on the base through spraying, and the attraction electrode being porous and formed inside the dielectric body through spraying.

2. The substrate suction apparatus according to claim 1, wherein the suction portion of the vacuum suction mechanism is composed of a plurality of grooves recessed on the base surface and one or more suction channels provided inside the base.

3. The substrate suction apparatus according to claim 1, wherein the base is formed of a porous material, and its side surfaces and bottom surface are covered in an airtight manner with a nonporous member; the suction portion of the vacuum suction mechanism is composed of numerous pores of the base and a suction channel provided to the nonporous member.

4. The substrate suction apparatus according to any one of claims 1 to 3, wherein the dielectric body is composed of a downmost dielectric layer formed as a lamina on the base through spraying, one or more intermediate dielectric layers formed as a lamina on the downmost dielectric layer through spraying; and a topmost dielectric layer being formed as a lamina in a topmost position through spraying and having a surface employed as the suction surface; the average pore diameter and porosity of the downmost dielectric layer being set maximum, the average pore diameter and porosity of the topmost dielectric layer being set minimum.

5. The substrate suction apparatus according to claim 4, wherein the average pore diameter and porosity of the pores in the downmost dielectric layer are set to 20 μm to 200 μm and 25% to 60%, respectively; the average pore diameter and porosity of the pores in the one or more intermediate dielectric layers and the attraction electrode are set to 10 μm to 150 μm and 20% to 50%, respectively; and the average pore diameter and porosity of the pores in the topmost dielectric layer are set to 5 μm to 20 μm and 5% to 25%, respectively.

6. The substrate suction apparatus according to any one of claim 1, wherein the dielectric body is formed by spraying ceramic particles; the attraction electrode is formed by spraying tungsten particles, molybdenum particles or nickel aluminum particles.

* * * * *